US005202584A

United States Patent [19]

Burke et al.

[11] Patent Number: 5,202,584

[45] Date of Patent: Apr. 13, 1993

[54] HIGH ENERGY DISSIPATION HARMONIC FILTER REACTOR

[75] Inventors: Patrick E. Burke, North York, Canada; Norbert Pewny, Gressen, Fed. Rep. of Germany

[73] Assignee: BBA Canada Limited, Scarborough, Canada

[21] Appl. No.: 753,050

[22] Filed: Aug. 30, 1991

[51] Int. Cl.[5] .......................... H02J 3/01; H03H 7/09

[52] U.S. Cl. .................................... 307/105; 333/175; 333/177

[58] Field of Search .................... 361/111, 113, 54, 58; 307/102, 103, 105; 323/205-211, 901, 908; 363/39, 40, 44, 45, 47-49; 322/58; 338/210, 278, 294, 333; 333/167, 172, 175-180, 185; 336/155, 160, 165, 69, 70, 177

[56] References Cited

U.S. PATENT DOCUMENTS 2,404,404 7/1946 Roberds .
2,907,965 10/1959 Mercier .
3,225,319 12/1965 Trench .
3,264,590 8/1966 Trench .
3,696,315 10/1972 Riggins .
3,708,875 1/1973 Martincic et al. .
3,808,562 4/1974 Weigel et al. .
3,902,147 8/1975 Trench .
3,991,394 11/1976 Barnwell et al. .
4,158,864 6/1979 Kennon .......................... 361/113 X
4,405,963 9/1983 Holtzman ....................... 361/113 X
4,819,120 4/1989 O'Leary ............................... 361/58
4,937,540 6/1990 Carlson et al. ................. 333/181 X

FOREIGN PATENT DOCUMENTS 1017029 1/1966 United Kingdom .

*Primary Examiner*—A. D. Pellinen
*Assistant Examiner*—Fritz M. Fleming
*Attorney, Agent, or Firm*—Stanley E. Johnson

[57] ABSTRACT

An air core inductor having mounted thereon a band of material of selected characteristics providing only an electromagnetically coupled resistance that reflects back into the windings of the inductor for filtering applications.

22 Claims, 3 Drawing Sheets

HIGH ENERGY DISSIPATION HARMONIC FILTER REACTOR

FIELD OF INVENTION

This invention relates generally to air-core reactors for power transmission systems and more particularly concerns an air-core reactor in spaced relation with respect thereto in combination with a resistive element mounted on the reactor an electrically insulated therefrom resistive element is preferably physically in the form of a band and made preferably from a high resistance, temperature stable material. The resistive element performs two tasks, one of which is to act as a resistor in a filter circuit and the other is to act as a thermal dissipator.

Reactors of the present invention are characterized by having a very low quality factor at a selected frequency, or band of frequencies which are higher than the power system frequency and are required to absorb extremely large energies at this frequency or band of frequencies.

BACKGROUND OF INVENTION

Power system reactors are often used in combination with resistors and capacitors to perform filtering functions, to control the inrush and outrush from capacitor banks, etc. In many of these applications the parallel combination of a reactor and a resistor appear. The purpose of this combination is to alter the native characteristics of the reactor at frequencies higher than the system frequency such that the combination presents a much lower quality factor to these frequencies and absorbs very large power at these frequencies.

The combination of a reactor and resistor in parallel is used for example in series with a capacitor to form a filter which presents a high impedance to the power frequency but a much lower impedance to a band of harmonic frequencies. Another arrangement is where the capacitor is also in parallel with the coil and resistor. This latter filter circuit presents a high impedance to a band of harmonic frequencies and a low impedance to the power frequency. In both cases, the resonant frequency is established primarily by the inductance and capacitance of the circuit and the bandwidth primarily by the resistance.

A third combination which consists of the foregoing arrangements in series results in a filter which presents a low impedance to two selected frequencies, these frequencies being established by the choice of the LC combinations for the two parts of the filter.

All three of the above combinations are often used to filter out harmonics generated by power semiconductor switching devices on power systems, for example, in DC to AC transformations and for controlling the reactor power flow in static compensator systems.

The combination of a reactor and a resistor in parallel is also used to control the inrush and outrush from large capacitor banks when these are switched in and out of power systems.

The resistors conventionally used in parallel with reactors are separate devices and in the case of outdoor installations must be housed in waterproof enclosures. The chief advantage of the separate resistor is the fact that the dissipation depends only on the voltage across the resistor (and therefore, the voltage across the reactor) and is independent of the frequency. The use of the separate parallel resistor for dissipation of large amounts of energy, however, is costly both in terms of the equipment itself and in terms of installation space required.

A filter choke capable of handling high power levels is disclosed in U.S. Pat. No. 3,808,562, issued Apr. 30, 1974 and includes a choke coil and an active resistance element connected in parallel with the choke coil. The active resistive element is magnetically neutral, neither generating a magnetic field to influence the choke coil nor is it noticeably influenced by the magnetic field of the choke coil.

SUMMARY OF INVENTION

A principal object of the present invention is to provide an air core reactor with a resistive element that is only electromagnetically coupled during use and which is also capable of dissipating high energy levels.

In accordance with the broadest aspect of the present invention there is particularly provided a reactor capable of handling high energy levels comprising an open ended tubular air core reactor and at least one band, of selected resistive material, arranged in a closed loop encircling a selected portion of said tubular reactor, said band having a width extending in a direction lengthwise of the tubular reactor which is substantially greater than its thickness which is perpendicular to the longitudinal axis of the tubular reactor and means supporting said band at a position radially spaced from the reactor and electrically insulated from the winding of the reactor, said band of resistive material being responsive to electromagnetic fields generated by the reactor.

In accordance with a specific aspect of present invention, there is particularly provided a reactor capable of handling high power levels and which includes coaxial, coextensive, cylindrical coils with a multi-arm spider at at least one end thereof for connecting the coil windings in parallel and permitting fractional turns for the different windings and a resistance element electrically insulated from the coils, but responsive to electromagnetic fields generated thereby during use thereof inducing therein $I^2R$ losses which are reflected back into the coils causing the quality factor Q to be lowered. The resistance element is responsive only to an electromagnetic field and therefore is an electromagnetically coupled resistance element. The resistance element comprises one or more bands of resistive material in the form of a closed loop that is coaxial with, in close proximity to and radially spaced from the coil(s). The band(s) is mounted by band mounting means that retains the same in fixed relation relative to the coil and electrically insulates the same therefrom. Each band is made of a material in which the resistance is substantially unaffected by temperature change, herein referred to as a temperature stable material. The material may, for example be a nickel chromium alloy such as known by the Trade-Mark Nichrome.

LIST OF DRAWINGS

The invention is illustrated by way of example in the accompanying drawings wherein.

DESCRIPTION OF PREFERRED EMBODIMENT

Figure 1:
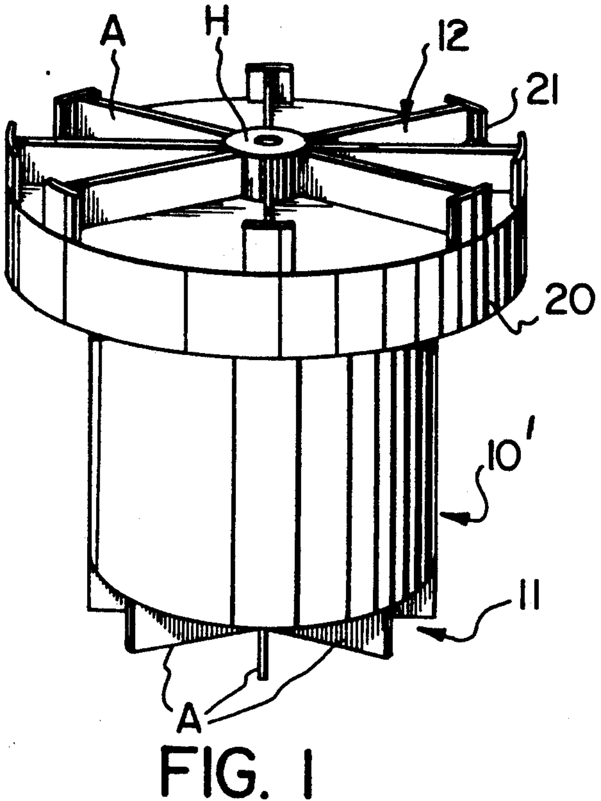
FIG. 1 is an oblique diagrammatic view showing the physical arrangement of a filter provided in accordance with the present invention.
Figure 3:
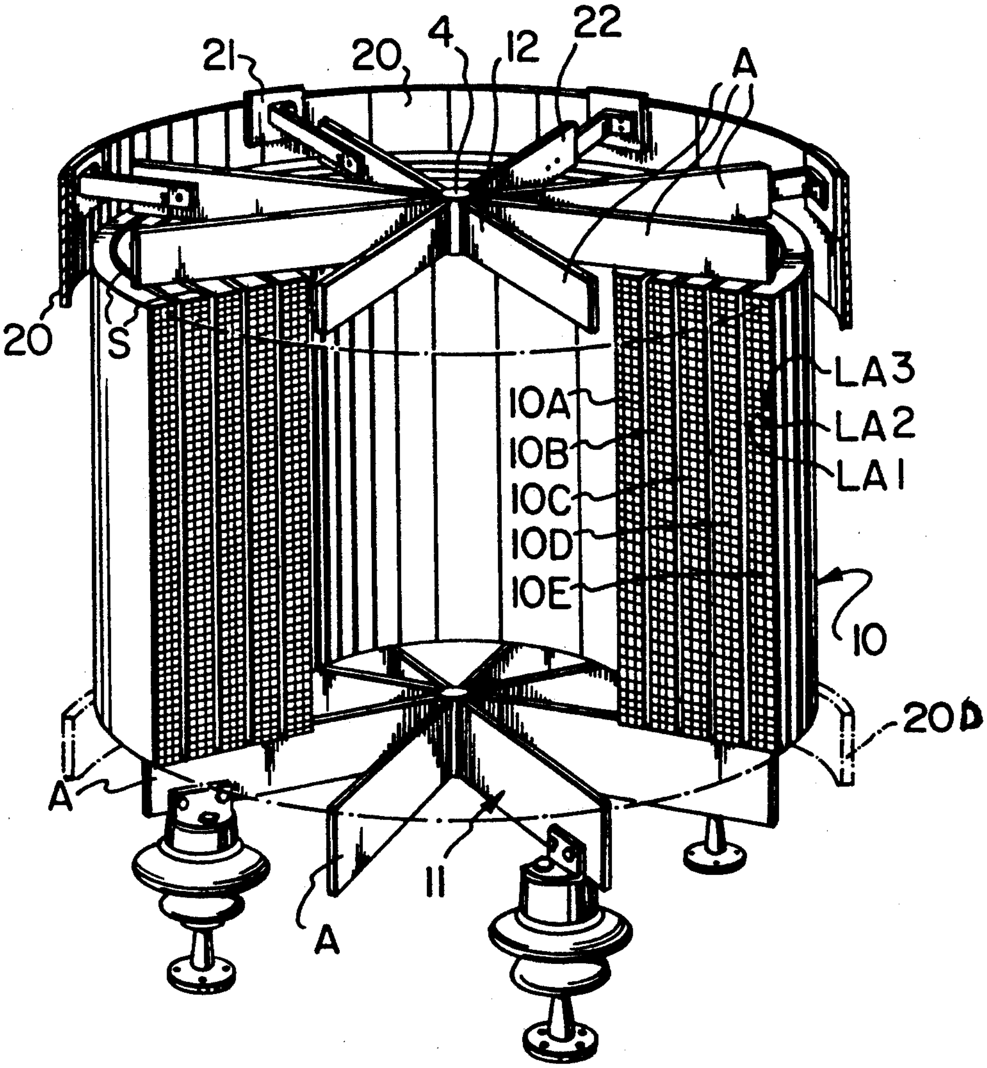
FIG. 3 is a partial sectional, oblique view illustrating in more detail an air core reactor with a band of high resistance material mounted thereon to provide a filter in accordance with the present invention for handling high power levels.

Illustrated in FIGS. 1 and 3 is a rigid open ended cylindrical coil unit having two multi-armed spiders with one being located at one end and the other at the opposite end thereof. If desired there may be only one multi arm spider located at one end of the coil unit. The coil unit 10, illustrated in FIG. 3 consists of a plurality of rigid cylindrical coils designated 10A, 10B, 10C, 10D and 10E disposed coaxially and they are radially spaced from one another by spacers designated S providing air channels therebetween. Spiders 11 and 12, at the opposite ends, provide means for connecting the coils in parallel and also ,for terminating the coil windings at different circumferential positions allowing for partial, i.e., fractional turns as is known in the art. Coils and spiders of this general construction and variations thereof are known from the teachings of applicant's U.S. Pat. Nos. 3,902,147 issued Aug. 26, 1975; 3,225,319 issued Dec. 21, 1965; 3,264,590 issued Aug. 2, 1966; and British Patent 1,017,029 published Jan. 12, 1966, a patent of addition to British Patent No. 1,007,569 dated May 29, 1962; the substance of which references is incorporated herein by reference thereto.

The spiders 11 and 12 (FIG. 1) at opposite ends of the coil unit, each have a central hub H from which radiate a plurality of arms A. The spiders at opposite ends are tied together by suitable tie means (not shown). The coils 10A, 10B, 10C, 10D and 10E may consist of one or more layers (radially side-by-side), designated for example LA1, LA2 and LA3 in FIG. 3, of windings of insulated conductor each having a beginning at one end of the unit and an ending at the opposite end with such opposite ends being connected respectively to spiders 11 and 12. Spider 11 can be omitted if desired and replaced by a mounting means for the reactor and suitable connection means connecting the coil windings at such end. Each layer may be one or more conductors high (axial direction of the coil), all of the windings being helical and of insulated conductor.

FIG. 1 illustrates the present invention in its simplest form and comprises an electromagnetically coupled resistance element 20 in the form of a band of material coaxial with and radially spaced from a coil unit 10'. Coil $10^1$ preferably is essentially the same as coil unit 10 described above but in its simplest form could be a single cylindrical coil (air core). Band 20 is a thin band of high resistance material such as a nickel alloy, for example Nichrome™ or the like temperature stable material in the form of a continuous closed loop. The band is mounted on the reactor, by way of example on supports 21 located at the outer end of the arms A of the spider. Supports 21 may be pads mounted directly on the ends of the arm as seen in FIG. 1 or attached thereto by brackets 22 as shown in FIG. 3. The band 20 in the embodiment illustrated in FIG. 1 is located at one end of the coil unit. It can be however be variously located at different selected positions along the axis of the coil unit depending upon the coupling factor desired. In most cases a close coupling is desired the results of which are achieved by the location shown in FIG. 1. Arms A of the spider are electrically conductive and mounting supports 21 are therefore of necessity made of insulative material (or at least mounted on the arms by insulating means) electrically insulating band 20 from the spider arms.

Figure 2:
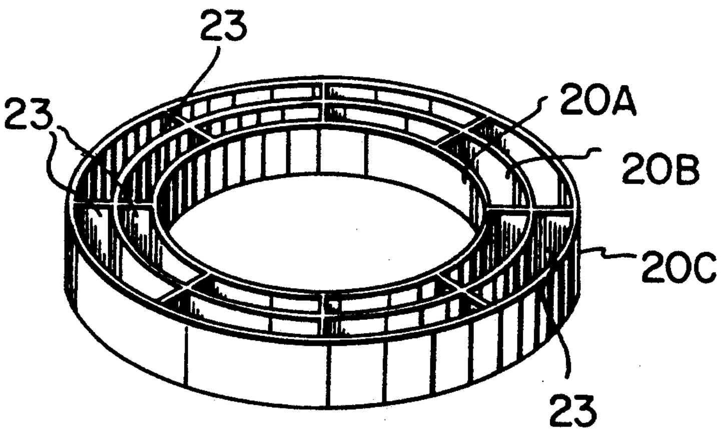
FIG. 2 is an oblique view illustrating modifications to the resistance element of the filter shown in FIG. 1.

Instead of a single band as shown in FIG. 1, two or more bands may be used and the two or more bands may be variously arranged and variously positioned. Referring to FIG. 2 one arrangement is illustrated which consists of a group of co-axial radially spaced bands with three individual bands being illustrated and designated 20A, 20B and 20C. These bands are radially spaced and connected one to the next by radial spacers 23. The spacers are metallic and welded or otherwise solidly secured to the bands making the plurality of bands a strong rigid integral unit. The spacers need not be made of an insulating material since they do not affect the operation of the apparatus. It is, however, essential that the bands be electrically insulated from the electrically conductive portion of the spider arms which, as previously mentioned, serve to connect the multiple coil windings in parallel and also serve to provide fractional turns for the windings. The number of and location of spacers 21 can be varied dependent upon the strength required in the structure. The numer of and the location of the bands and the arrangement of the bands may be varied depending upon the physical and/or electrical results desired. There may for example be only two bands one being located as illustrated in FIG. 1 and another for example 20D mounted on spider 11 as indicated by broken line in FIG. 3. Also while the bands are shown mounted on the spiders they can be mounted by other means not shown.

When the reactor is energized its magnetic field links the short circuited loop (or loops) provided by the band (bands) of resistive material inducing currents in them. Since the bands are made of high resistance material, an $I^2 R$ loss is induced in them and this loss is reflected back into the coil causing the quality factor Q of the coil to be lowered.

The number of bands, the material from which the bands are made, the thickness of the bands, their width, their diameter and the placement of the bands with respect to the coil midplane are chosen to accomplish the following results:

(1) the power dissipated in the bands at the designed frequency must be as specified by the filter design;

(2) the resistance of the bands should be sufficiently high that the current flowing in them is virtually in phase with the induced voltage, i.e., the inductive reactance of the bands at the specified frequency should be very much less than the resistance of the bands;

(3) the number of bands used and their width in the axial direction of the coil are chosen so that the surface area presented by the dissipative element will be sufficient to ensure that its temperature rise does not exceed a specified maximum. For example, if the specified maximum temperature rise for the dissipative device is 200 degrees centigrade, then the total surface area of all of the bands should be sufficiently large that the power dissipation in the bands is not more than about 0.7 watts per square centimetre of surface area.

The design of the dissipative element must be integrated with the design of the reactor. Most power reactors used for filtering applications consist of concentric helices which are connected in parallel by spider devices at the top and bottom of the reactor. The design of the rector itself is very complicated since all of the paralleled layers are coupled and interact with each other. In order to guarantee that the current will be shared appropriately among the different layers of the reactor this coupling must be taken into account during the design and the exact number of turns and partial turns for each layer are chosen to make sure that the proper current balance is established.

When the dissipative element is added to the reactor, all of the bands are coupled to all of the layers of the reactor. When currents are induced in the bands of the dissipative element these currents interact with the main coil layers and will cause the current balance in them to change from the balance established if the coil is designed alone. Thus, the entire device, coil and dissipative element, must be designed with a program on an inter-active basis which results in the proper inductance of the coil, the proper balance of currents in the various layers of the coil, the appropriate total loss in the dissipative element at the designed frequency, sufficient surface area in the dissipative element in order to guarantee a temperature rise which does not exceed a specified maximum, and lastly the current flowing in the bands of the dissipative element must be virtually in phase with the induced voltage in the elements. This means that the resistance of each band of the dissipative element must be large compared to the effective reactance of each band at the specified operating frequencies.

Applicant's dissipation system for power filtering applications has the following advantages:

(1) the system can obtain levels of dissipation and resulting low Q factors for coils which is far in excess of that which can be obtained by eddy currents in the reactor itself or in surrounding structures;

(2) the resulting characteristics of the reactor plus dissipative element are comparable to the case where a reactor is used in parallel with a separately designed resistor. However, the former is less expensive than the latter;

(3) compared to the system in which a secondary is wound on a reactor to which is connected a resistor element, applicant's system is very much less expensive;

(4) applicant's system is very simple and therefore much more maintenance free than existing systems;

(5) because a dissipation element is incorporated with the reactor design, applicant's system takes up less space than other systems and is therefore less expensive to install;

(6) applicant's system can be designed for very high BIL levels since the impulse level depends primarily on the design of the reactor and the dissipative element does not change the impulse withstand of the reactor significantly. This is in contrast to the use of a separate resistor where the resistor element also must be designed to withstand the high impulse levels and this impacts significantly on the cost of the resistor element;

(7) no separate enclosure is required for the dissipation element in applicant's system whereas systems using separate resistors require housings for these resistors.

Figure 4:
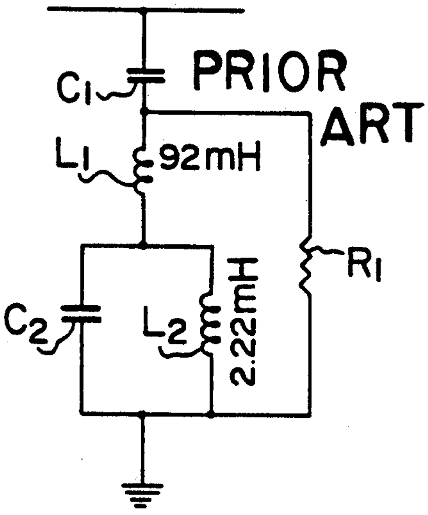
FIG. 4 is a circuit diagram of an illustrative embodiment of a conventional filter arrangement designed to pass the 11th and 13th harmonics.
Figure 5:
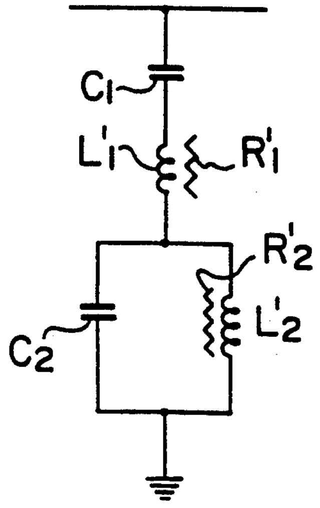
FIG. 5 is a circuit diagram of the present invention designed for the same parameters as in FIG. 4.
Figure 6:
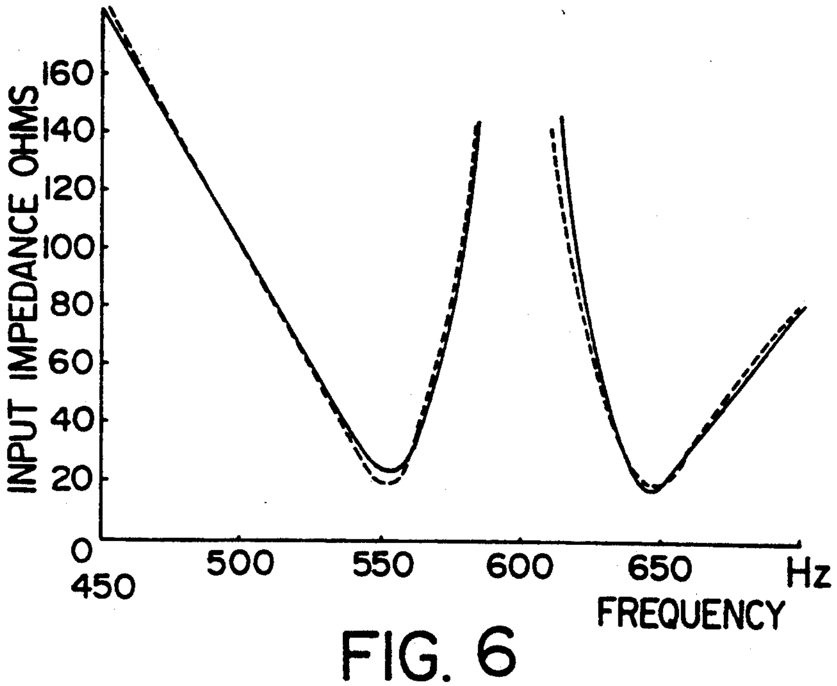
FIG. 6 is a graph showing the input impedance curves for the respective arrangements of FIGS. 5 and 6.

A comparison of the present filter arrangement with a previously known arrangement by way of example only is illustrated in FIGS. 4 to 6. FIG. 4 is a circuit diagram for a filter designed to pass the 11th and 13th harmonics in a 50 CPS power system. The circuit as illustrated includes capacitors $C_1$ and $C_2$, inductive coils $L_1$ and $L_2$ and a resistor R1 in a series parallel arrangement as illustrated. The resistor R1 has a rating of 350 kilowatts. The solid line curve in FIG. 6 shows the input impedance (ohms) curve for such filter combination. The dotted line curve is for the equivalent filter constructed according to this invention where the total harmonic power of 320 kilowatts is dissipated in the electromagnetically coupled resistance elements $R_1^1$ and $R_2^1$ added to the two reactors $L_1^1$ and $L_2^1$ shown in the circuit diagram of FIG. 5. The coupled resistor $R_1^1$ of reactor $L_1^1$ comprises six concentric Nichrom™ rings, each 16 inches high, 0.085 inch thick and having diameters of 91, 93, 95, 97, 99 and 101 inches. This unit dissipates 230 kilowatts at a temperature rise of 200° C. The coupled resistor element $R_2^1$ of coil $L_2^1$ comprises three concentric Nichrome* rings, each 8 inches high and 0.01 inch thick and having diameters of 80, 82 and 84 inches. This unit dissipates 90 kilowatts.

By way of cost comparison the 320 kilowatts resistor unit R1 in FIG. 4 is about $10,000.00 while the total cost of the coupled resistor units for reactors $L_1^1$ and $L_2^1$ is only about $5,000.00.

While Nichrome™ was used for the foregoing and is the preferred material for the band for some applications its high resistivity makes it unsuitable for some applications. The material characteristics must be taken into account depending upon its application. It is important that the material be temperature stable. Some other alloys considered suitable are nickel-copper and chromium aluminium.

The magnetic coupled bands of the filter has perceived disadvantages below certain Q values (quality factor). Tests have shown that attempts made at reaching a Q of 6 the current in the band was not in phase with voltage. It appears that as frequency goes up, for a given voltage, the power falls off and in some applications it may be more efficient to use known filter arrangements with a hard wired resistance.

We claim:

1. A device for use in electrical power distribution systems and capable of handling high power levels comprising:

(a) an air core open ended cylindrical coil unit having a plurality of helical coil windings of insulated conductor each beginning at one end of said unit and ending at an opposite end thereof;

(b) a multi-arm spider unit, comprising a plurality of arms radiating outwardly from a central hub, located at at least one of said opposite ends of the cylindrical coil unit, said coil windings at said end being connected to selected arms of the spider unit associated therewith;

(c) an electromagnetically coupled resistance element for said coil comprising a band of resistive material circumscribing a portion of said coil unit and spaced radially therefrom.

(d) band mounting means retaining said band in fixed spaced relation relative to said coil unit; and (e) means electrically insulating said band from said coil windings, said resistance element being operative solely by electromagnetic coupling with said coil windings lowering the quality factor Q of said coil unit at a selected frequency, or band of frequencies higher than the power system operating frequency.

2. A device as defined in claim 1, wherein said band is mounted on radial outer ends of the arms of the spider and electrically insulated therefrom.

3. A device as defined in claim 1 including one or more further bands of resistive material, said bands being spaced with respect to one another and means retaining said bands in fixed spaced relation relative to said coil unit.

4. A device as defined in claim 3 wherein said bands are coaxial and radially spaced with respect to one another and said cylindrical coil unit and means retaining said bands in fixed radial spaced relation relative to one another.

5. A device as defined in claim 1 wherein said band is located adjacent one end of said cylindrical coil unit.

6. A device as defined in claim 1 wherein said resistance element is a thin band of a nickel alloy material.

7. A filter arrangement, for a power transmission system having a power system operating frequency, comprising an LC circuit wherein the inductor of said LC circuit is an air core reactor having a resistance element operative solely by direct electromagnetic coupling with coil windings of said reactor for lowering the quality factor Q of the reactor at a selected frequency or band of frequencies higher than said power system operating frequency, said resistance element conductively insulated from the inductor.

8. The arrangement of claim 7 wherein said resistance element is a closed loop band of selected material having a temperature stable resistivity essentially unaffected by temperature change.

9. The arrangement of claim 8 wherein said material is a high resistance temperature stable nickel alloy material.

10. A filter arrangement as defined in claim 7 wherein said resistance element comprises a band of nickel alloy material and means mounting said band on said reactor, said band circumscribing said reactor and being disposed in spaced relation outwardly therefrom.

11. A filter system for an electrical power distribution installation comprising a first parallel connected LC arrangement connected in series with a second serially arranged LC arrangement each of which is of predetermined capacity and wherein the inductor of each LC arrangement is an air core reactor having a resistance element, operative solely by electromagnetic coupling with said reactor, said resistance element being a band of resistance material radially spaced from the inductor associated therewith to dissipate predetermined energy, said coupling being responsive to selected predetermined frequencies lowering the quality factor Q of the reactor at said selected predetermined frequencies.

12. An electrical filter capable of handling high energy levels comprising:

(a) an open-ended tubular air core reactor having opposite ends and at least one coil winding beginning at one of said opposite ends and an ending at the other of said opposite ends;

(b) at least one band of selected resistive material arranged in a closed loop encircling a selected portion of said tubular reactor, each said band having a width in a direction lengthwise of the tubular reactor that is substantially greater than its total thickness which is perpendicular to said lengthwise direction; and (c) means supporting each said band at a position radially spaced from said reactor and electrically insulated from said windings, each said band of material providing a resistance for the reactor and operative only by direct electromagnetic coupling with each said winding for lowering the quality factor Q of the reactor at a selected frequency, or band of frequencies, higher than a power system frequency of a power distribution system in which it is used.

13. The apparatus of claim 12 wherein said air core reactor comprises a rigid multi winding air core coil unit.

14. The apparatus of claim 12 wherein each said band is made of nickel alloy material.

15. The apparatus of claim 12 wherein said air core reactor has a multi-arm electrically conductive spider at one end thereof, wherein each said coil winding at said one end is electrically connected to a selected arm of said spider and wherein each said band is supported by said spider.

16. The apparatus of claim 15 including a further multi-arm spider at an end of said reactor opposite said one end.

17. Apparatus for use in an AC power transmission system comprising:

an air core reactor unit, a resistance for said reactor operative solely by electromagnetic coupling therewith, said resistance comprising a metallic element electrically isolated from coil windings of said reactor and positioned in magnetic coupling with said windings, and means mounting said metallic element on said reactor in spaced relation therewith for dissipating large quantities of heat from said metallic element without adversely damaging said reactor, said metallic element being responsive to electromagnetic fields generated by coil windings of said reactor by inducing, during use, at a selected frequency or band of frequencies higher than a power frequency of the power transmission system, $I^2R$ losses that reflect back into said windings causing the quality factor Q of the said reactor to be lowered at said selected higher frequency.

18. Apparatus as defined in claim 17 wherein said metallic element comprises a closed loop thin band mounted on said reactor unit.

19. Apparatus as defined in claim 17 wherein said air core reactor unit has a spider on one end thereof, said spider comprising a hub having a plurality of arms radiating outwardly therefrom and wherein said band is mounted on outer ends of said arms and electrically insulated therefrom.

20. In an air core reactor unit for an electrical power distribution system, the reactor unit having a coil winding therein, the improvement comprising:

a resistance element for dissipating power and reducing a quality factor Q of said coil winding in a predetermined frequency range greater than a predetermined operating frequency of the power distribution system, said resistance element radially spaced apart from said coil winding, an insulator for electrically insulating said resistance element from said coil winding, said resistance element being electrically connected to said coil winding only inductively by direct electromagnetic coupling of an electromagnetic field generated by said coil winding to said resistance element, whereby a current is induced in said resistance element through said electromagnetic coupling to generate $I^2R$ losses in said resistance element in said predetermined frequency range, said losses being inductively coupled to said coil winding.

21. An improved air core reactor unit as recited in claim 20, wherein said resistance element comprises a flat band of material having a temperature stable resistivity, said flat band forming a loop surrounding said coil winding and electrically insulated therefrom by said insulator.

22. An improved air core reactor unit as recited in claim 21, wherein said coil winding is cylindrically shaped and has a longitudinal axis defining a longitudinal direction thereof, and said flat band comprises a band of continuous sheet-like material having a length in said longitudinal direction which is substantially greater than a thickness of said band in a direction perpendicular to said longitudinal direction.

* * * * *